(12) United States Patent
Song et al.

(10) Patent No.: US 7,173,489 B1
(45) Date of Patent: Feb. 6, 2007

(54) PROGRAMMABLE GAIN VOLTAGE BUFFER

(75) Inventors: Yonghua Song, Saratoga, CA (US); Sang Won Son, Sunnyvale, CA (US)

(73) Assignee: Marvell Semiconductor, Inc., Hamilton (BM)

(*) Notice: Subject to any disclaimer, the term of this patent is extended or adjusted under 35 U.S.C. 154(b) by 66 days.

(21) Appl. No.: 10/648,632

(22) Filed: Aug. 25, 2003

(51) Int. Cl.
*H03F 3/45* (2006.01)

(52) U.S. Cl. ........................ 330/254; 330/278
(58) Field of Classification Search ................ 330/254, 330/278, 282
See application file for complete search history.

(56) References Cited

U.S. PATENT DOCUMENTS

| | | | |
|---|---|---|---|
| 5,412,346 A * | 5/1995 | Burger et al. ............... 330/282 |
| 5,450,030 A | 9/1995 | Shin et al. ................... 327/525 |
| 5,933,771 A * | 8/1999 | Tiller et al. .................. 330/254 |
| 6,069,504 A | 5/2000 | Keeth .......................... 327/108 |
| 6,141,258 A | 10/2000 | Kawasumi ............. 365/189.05 |
| 6,151,258 A | 11/2000 | Sample et al. ......... 365/189.05 |
| 6,292,014 B1 | 9/2001 | Hedberg ....................... 326/30 |
| 6,316,996 B1 * | 11/2001 | Puotiniemi .................. 330/254 |
| 6,347,850 B1 | 2/2002 | Volk ............................. 326/82 |
| 6,424,222 B1 * | 7/2002 | Jeong et al. ................. 330/278 |
| 6,445,241 B2 | 9/2002 | Gabara ........................ 327/404 |
| 6,462,588 B2 * | 10/2002 | Lau et al. .................... 327/108 |
| 6,563,382 B1 * | 5/2003 | Yang ........................... 330/254 |
| 6,583,661 B1 * | 6/2003 | Tanji et al. ................. 330/254 |
| 6,710,657 B2 * | 3/2004 | Yang ........................... 330/254 |

* cited by examiner

*Primary Examiner*—Khanh Van Nguyen

(57) ABSTRACT

A programmable gain voltage buffer circuit with a programmable gain may include transistors in parallel with resistors. The transistors may be used as variable resistors, with the resistors predominating the equivalent resistances at output points in different branches of the buffer circuit. The transistors may have resistances corresponding to programmable gain steps in the circuit.

39 Claims, 3 Drawing Sheets

PROGRAMMABLE GAIN VOLTAGE BUFFER

BACKGROUND

Integrated circuits often require substantially constant bias voltages. A voltage reference circuit may be used to generate a precise voltage for use by other circuits. However, when more than one load circuit shares the same voltage reference, the collective load capacitance imposed by such circuits on the voltage reference can be substantial. Furthermore, some of the load circuits may involve transistor switching and/or coupling and decoupling capacitors to and from the voltage reference, both of which may result in large current spikes being drawn from the voltage reference.

A voltage buffer may be used to buffer voltages between the reference circuit and the load circuits. A programmable gain voltage buffer, which has a programmable gain, may be use to provide a stable reference voltage over a variety of circuit conditions.

SUMMARY

The present application relates to a programmable gain voltage buffer, which may be implemented in a variety of electrical devices and systems. The programmable gain voltage buffer may be particularly suitable for a deep submicron and high speed circuit with relatively low load resistance values and large current values in small circuit geometries.

An aspect of the application relates to a system comprising a voltage buffer. The voltage buffer comprises first, second, third and fourth transistors and first and second resistors. The first and second transistors are configured to receive first and second input signals, respectively. The first resistor is coupled to the first transistor. The second resistor is coupled to the second transistor. The third transistor is coupled in parallel with the first resistor. The fourth transistor is coupled in parallel with the second resistor. The third and fourth transistors are configured to receive control signals to adjust a voltage gain of (a) a first output point between the first transistor and the first resistor, and (b) a second output point between the second transistor and the second resistor.

DETAILED DESCRIPTION

Figure 1:
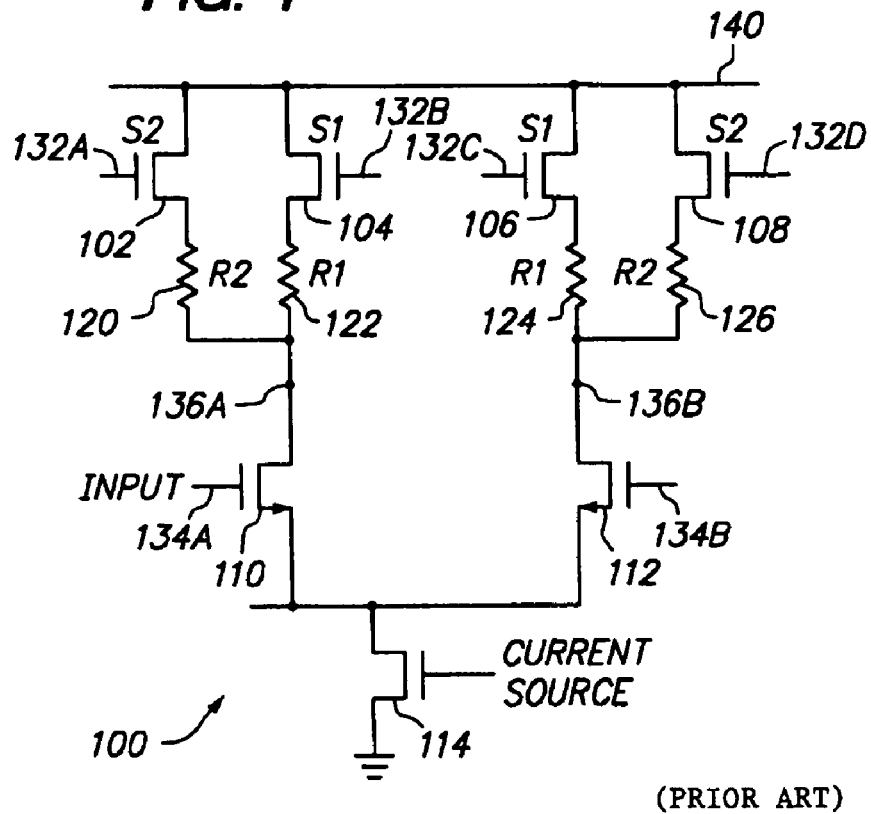
FIG. 1 illustrates an example of a conventional programmable gain voltage buffer.

FIG. 1 illustrates an example of a conventional programmable gain voltage buffer circuit 100. The programmable gain voltage buffer may be used to buffer voltages between two circuits, e.g., a voltage reference circuit and one or more load circuits. The programmable gain voltage buffer has a gain that may be controlled to change in programmable gain steps.

Input lines 134A and 134B may receive a differential input signal, e.g., two voltage signals equal in magnitude but out of phase. Output points 136A and 136B may each provide an output signal with a gain. If the difference between both output points 136A, 136B is taken as an output, the differential gain effectively doubles relative to the individual gain which would exist between one input 134A and one output point 136A, because the individual gains are out of phase.

The gain of the programmable gain voltage buffer circuit 100 depends on the total equivalent resistance seen by the output points 136A and 136B. The total equivalent resistance (and the gain) may be adjusted by switching transistors (S1) 104, 106 and transistors (S2) 102, 108 ON and OFF to effectively insert or remove resistors (R1) 122, 124 and resistors (R2) 120, 126 from the circuit 100.

A disadvantage of the programmable gain voltage buffer circuit 100 of FIG. 1 is the relatively large area required by the four resistors 120–126. Also, the transistors 102–108 may need to be relatively large, increasing the parasitic capacitance, which may slow down the circuit.

Figure 2:
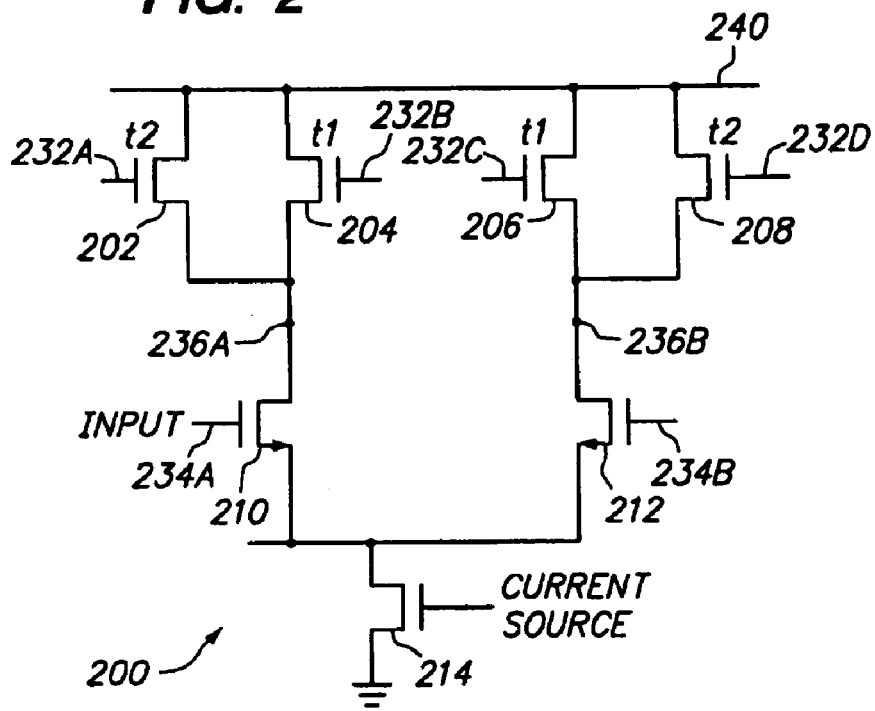
FIG. 2 illustrates another example of a programmable gain voltage buffer.

FIG. 2 illustrates a variation of the programmable gain voltage buffer circuit 100 in FIG. 1. The programmable gain voltage buffer circuit 200 uses transistors (t1) 204, 206 and transistors (t2) 202, 208 as variable resistors. Switching of the transistors ON and OFF controls the resistance at output points 236A and 236B, and thus the gain of the buffer circuit 200. However, the source-drain resistances ($R_{SD}$) of the t1 transistors 204, 206 and t2 transistors 202, 208 are nonlinear, and thus the control of the variable resistance (and gain) may be inaccurate.

Figure 3:
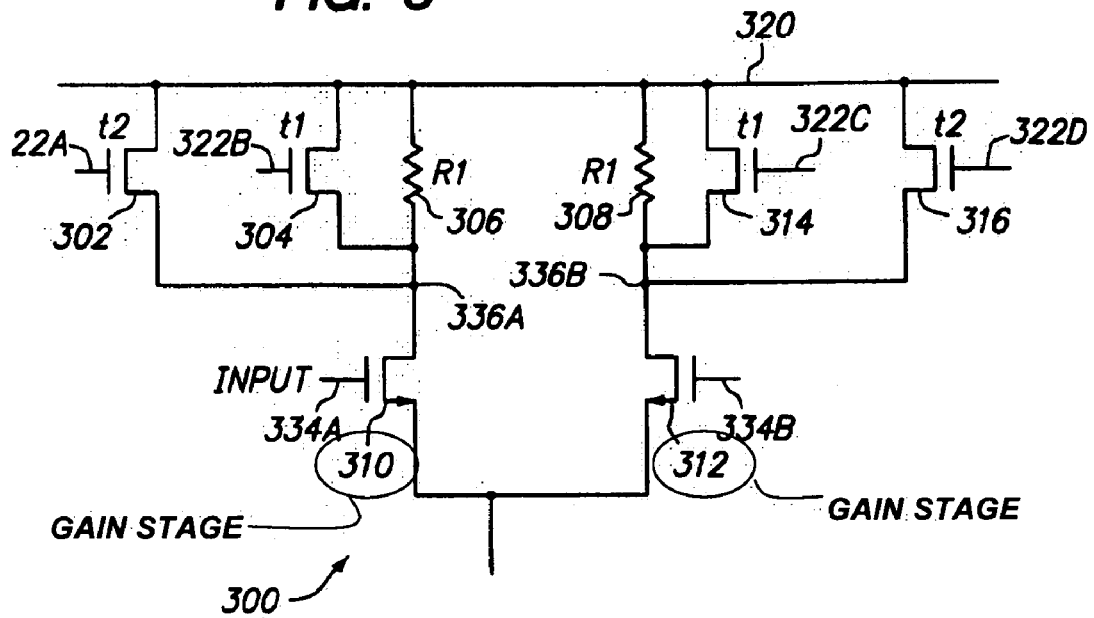
FIG. 3 illustrates a programmable gain voltage buffer according to an embodiment.

FIG. 3 illustrates a programmable gain voltage buffer circuit 300 according to an embodiment. The gain of the programmable gain voltage buffer circuit 300 depends on the total equivalent resistance seen by the output points 336A and 336B. In this circuit, the primary resistance is provided by resistors (R1) 306 and 308. Transistors (t1) 304, 314 and transistors (t2) 302, 316 are utilized as variable resistances to adjust the effective resistance value seen at the output points 336A and 336B. For example, when the t1 and t2 resistors 304, 302 and an input transistor 310 on the left side of the circuit are turned on, the equivalent resistance at the output point 336A is equal to the resistor 306 in parallel with the inherent resistances of the transistors 302, 304, 310. The equivalent resistance may be expressed as:

$$R_{equivalent} = R_{SD\ transistor\ 302} \| R_{SD\ transistor\ 304} \| R_{resistor\ 306} \| R_{SD\ transistor\ 310}$$

$$= ((1/R_{SD\ transistor\ 302}) + (1/R_{SD\ transistor\ 304}) + (1/R_{resistor\ 306}) + (1/R_{SD\ transistor\ 310}))^{-1}$$

Each resistor 306, 308 may have a resistance R (e.g., 1 kOhm). Each transistor 302, 304, 314, 316 may have an inherent source-drain resistance of, e.g., R, R/2, or R/4 kOhms (e.g., 1 kOhm, 500 Ohms, or 250 Ohms), which correspond to programmable gain steps of 1, ½, or ¼, respectively. By adjusting the resistance ratio of the transistors, different programmable gain steps can be achieved.

Adding more pairs of transistors in parallel with the resistors 306, 308 may provide a larger programmable gain control, but also increases the total size of the circuit 300, which may slow down the circuit. FIG. 3 only shows two pairs of transistors 302, 316 and 304, 314, but any number of pairs of transistors may be added in parallel with the resistors 306, 308.

The programmable gain voltage buffer circuit 300 of FIG. 3 may have several advantages over the buffer circuits shown in FIGS. 1 and 2.

Since the resistors 306, 308 in the buffer circuit 300 predominate, the t1 transistors 304, 324 and t2 transistors 302, 316 do not substantially affect the accuracy of the equivalent resistance. This provides accurate programmability without requiring physically large resistors.

The current through the resistors 306, 308 in FIG. 3 may be smaller than the current through the resistors 120–126 in FIG. 1 because most current flows through the t1 and t2 transistors. In deep sub-micron technology the contacts of the devices (e.g., transistors, resistors, etc.) are getting smaller and smaller, causing the current carrying capability of each contact to become smaller as well (typical around 0.2 mA/contact). However, in high speed applications, large currents (e.g., multi-mA) may be necessary. For a given resistance value, a transistor normally has a larger width than a resistor does, which allows a transistor to have more contacts than a resistor. More contacts allow a transistor, such as the transistor 304, to carry more current easier than a resistor, such as resistor 306. The transistors 102–108 in FIG. 1 are in series with the resistors 120–126, and the current must go through the resistors 120–126, which limits the total current level. In contrast, the transistors 302, 304, 314, 316 in FIG. 3 are in parallel with the resistors 306, 308, and the majority of current flows through these transistors instead of the resistors 306, 308. Thus, the current through the resistors 306, 308 in FIG. 3 can be much smaller than the current through the resistors 120–126 in FIG. 1.

The buffer circuit 300 in FIG. 3 may also provide a more accurate gain control than the buffer circuits 100 and 200 in FIGS. 1 and 2 because of the linear resistances of the resistors 306, 308, which are in parallel with the t1 transistors 304, 314.

The resistors 306, 308 in FIG. 3 may be smaller in size than the resistors 122, 124 in FIG. 1 since they only need to carry a smaller current. In addition, the t1 transistors 304, 314 in FIG. 3 may be smaller in size and have more current capability than the S1 transistors 104, 106 and S2 transistors 102, 108 in FIG. 1. The buffer circuit 300 in FIG. 3 as a whole may be smaller in size than the buffer circuits 100 and 200 in FIGS. 1 and 2. The smaller size may result in less parasitic capacitance, which may improve the speed of the circuit and lower power consumption.

Figure 4:
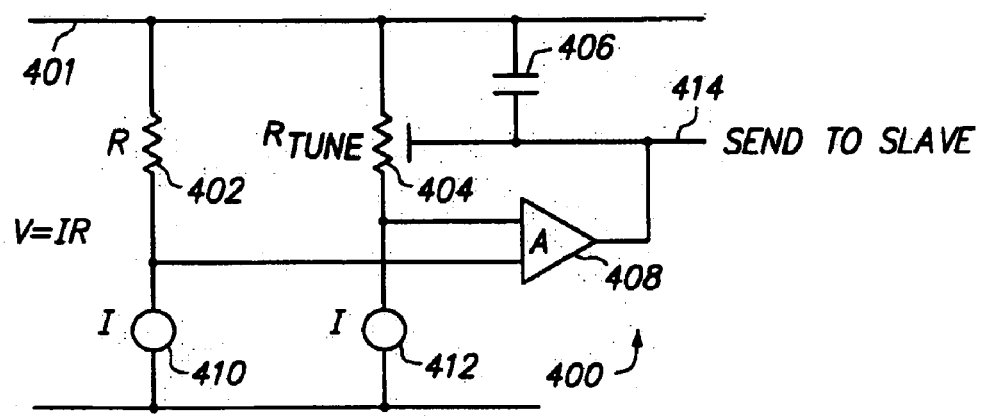
FIG. 4 illustrates a loop circuit that may be implemented with the buffer circuit in FIG. 3.

FIG. 4 illustrates a loop circuit 400 that may be coupled to the buffer circuit 300 in FIG. 3 to adjust or control the accuracy of the gain. The loop circuit 400 includes an output line 414, a resistor 402, a tunable resistor 404, a capacitor 406, an operational amplifier (op amp) 408, a first current source 410 and a second current source 412. The first current source 410 may provide the same amount of current as the second current source 412.

The resistor 402 may be referred to as a "reference". The voltage drop across the reference resistor 402 is equal to the current source 410 multiplied by the resistance of resistor 402, i.e., $V = I_{source410} R_{402}$. The tunable resistor 404 may be referred to as a "master", which follows the reference resistor 402. The voltage drop across the variable resistor 404 may be expressed as $V = I_{source412} R_{Tune404}$. The control loop will force $I_{source410} R_{402} = I_{source412} R_{Tune404}$ since $I_{source410} = I_{source\ 412}$. Thus, $R_{402} = R_{tune40}$, i.e., the control loop will force the master tunable resistor 404 to track the reference resistor 402.

The output line 414 of the operational amplifier 408 may be coupled to the capacitor 406 and may control the resistance of the tunable resistor 404 so that $R_{402} = T_{Tune404}$ remains valid across process and temperature variations. The output line 414 may be coupled to the control gates 322A, 322B, 332C, and 322D of the transistors 302, 304, 314, and 316 in FIG. 3 to provide a bias voltage. These transistors may be referred to as "slave" resistors because they share the same gate bias voltage as the master resistor 404 and therefore their resistances match the resistance of the master resistor 404, which tracks the reference resistor 402.

Figure 5:
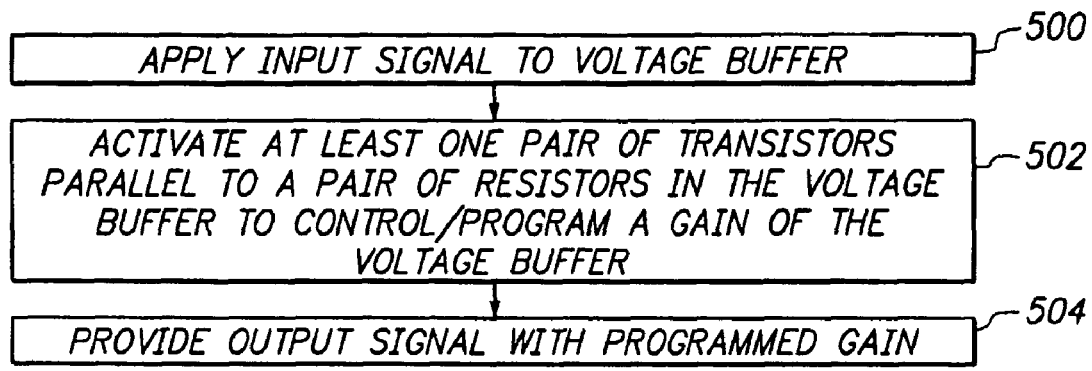
FIG. 5 illustrates a method of using the programmable gain voltage buffer of FIG. 3.

FIG. 5 illustrates a method of using the programmable gain voltage buffer circuit 300 of FIG. 3. An input signal is applied to a voltage buffer 300 at 500. Pair(s) of transistors (302,316 and/or 302,314) parallel to the pair of resistors 306, 308 in the voltage buffer 300 are activated to control the gain of the voltage buffer 300 at 502. The voltage buffer 300 provides an output signal with the programmed gain at 504.

Figure 6:
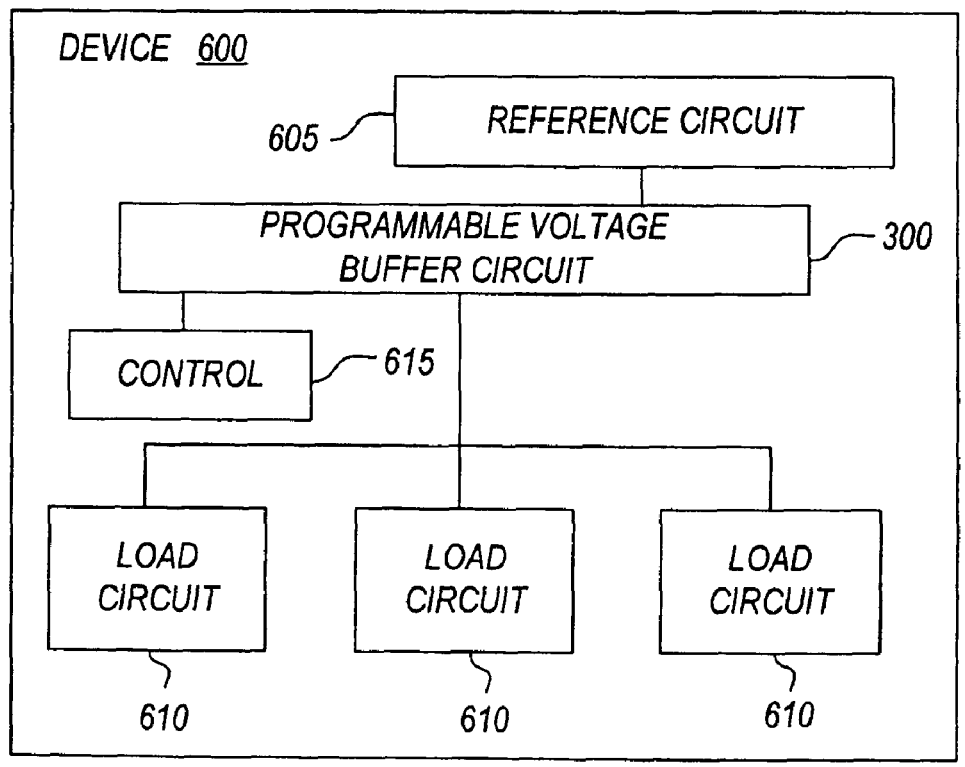
FIG. 6 illustrates a device with a programmable gain voltage buffer circuit.

FIG. 6 illustrates a device 600 with a programmable gain voltage buffer circuit 300 of FIG. 3. The buffer circuit may be coupled between two or more circuits, e.g., a voltage reference circuit 605 and a number of load circuits 610. The buffer circuit 300 may receive an input signal from the voltage reference circuit 605 and output a signal substantially equal to the input signal multiplied by a programmable gain. A control circuit 615 may control the programmable gain of the buffer circuit 300.

The programmable gain voltage buffer may be implemented in a variety of electrical devices and systems. The programmable gain voltage buffer may be particularly suitable for a circuit with relatively low resistance values and large current values in small circuit geometries.

A number of embodiments have been described. Nevertheless, it will be understood that various modifications may be made without departing from the spirit and scope of the application. For example, steps in the flowchart may be skipped or performed out of order. Accordingly, other embodiments are within the scope of the following claims.

The invention claimed is:

1. A programmable gain voltage buffer comprising:
   a gain stage;
   a programmable resistance coupled in series and in communication with the gain stage, the programmable resistance including a plurality of switches in parallel with a reference resistive element; and
   an output node coupled between the gain stage and the programmable resistance,
   wherein the plurality of switches are operable to change a gain at the output node.

2. The voltage buffer of claim 1, wherein the gain at the output node has a first gain value when a switch of the plurality of switches is activated and a second gain value when the switch is deactivated.

3. The voltage buffer of claim 1, wherein the plurality of switches are operable to change the gain in response to being activated and deactivated.

4. The voltage buffer of claim 1, wherein a switch of the plurality of switches provides a first resistance value in parallel with the reference resistive element when activated and is effectively removed when deactivated.

5. The voltage buffer of claim 4, wherein the first resistance value comprises a source-drain resistance of the switch.

6. The voltage buffer of claim 4, wherein the first resistance value of the switch corresponds to a programmable gain step for a circuit comprising the programmable resistance.

7. The voltage buffer of claim 1, wherein the voltage buffer comprises a differential voltage buffer including two branches, each branch including
   a gain stage, and
   a programmable resistance coupled in series and in communication with the gain stage, the programmable resistance including a plurality of switches in parallel with a reference resistive element.

8. The voltage buffer of claim 7, wherein at least one switch from each of the two branches are together operative to be activated and deactivated substantially simultaneously.

9. The voltage buffer of claim 1, further comprising a circuit operative to control an accuracy of the gain.

10. A programmable gain voltage buffer comprising:
   a gain stage;
   a programmable resistance coupled in series and in communication with the gain stage, the programmable resistance including a plurality of switches in parallel with a reference resistance element; and
   an output node coupled between the gain stage and the programmable resistance,
   wherein the plurality of switches are operable to change a gain at the output node, at least one switch being used as a variable resistance to adjust an effective resistance value at the output node, and the gain is proportional to an equivalent resistance at the output node.

11. A programmable gain voltage buffer comprising:
   a gain stage;
   a programmable resistance in communication with the gain stage, the programmable resistance including a switch in parallel with a resistive element; and
   a circuit operative to control an accuracy of the gain, the circuit comprising:
      a reference resistive element;
      a tunable resistive element in parallel with the reference resistive element, the tunable resistive element operative to track a resistance of the reference resistive element and having a gate with a bias voltage; and
      an output line coupled to the gate of the tunable resistive element and a gate of the switch.

12. A method comprising:
   applying an input signal to a voltage buffer;
   activating one or more selected switches in a plurality of switches in parallel with a predominant reference resistive element in the voltage buffer; and
   changing a gain of the buffer by at least a programmable gain step;
   wherein said changing the gain is realized at an output node coupled between a gain stage and a programmable resistance of the voltage buffer, the gain stage and the programmable resistance being configured in series.

13. The method of claim 12, wherein said applying the input signal comprises receiving a signal from a first circuit.

14. The method of claim 13, further comprising:
   providing an output signal to a second circuit.

15. The method of claim 14, wherein the first circuit comprises a reference voltage circuit.

16. The method of claim 15, wherein the second circuit comprises a load circuit.

17. A method comprising:
   applying an input signal to a voltage buffer;
   activating one or more selected switches in parallel with a predominant reference resistive element in the voltage buffer;
   changing a gain of the buffer by at least a programmable gain step by changing an equivalent resistance at an output point in the voltage buffer using the one or more selected switches as a variable resistance to adjust an effective resistance value at the output point; and
   providing an output signal from the output point coupled between a gain stage and a programmable resistance of the voltage buffer, wherein the gain stage and the programmable resistance are configured in series.

18. A device comprising:
   a first circuit operative to provide a voltage signal;
   a second circuit;
   a voltage buffer coupled between the first and second circuits and operative to provide a programmable gain to the voltage signal, the voltage buffer comprising:
      a gain stage;
      a programmable resistance coupled in series and in communication with the gain stage, the programmable resistance including a plurality of switches in parallel with a reference resistive element; and
      an output node coupled between the gain stage and the programmable resistance,
   wherein the plurality of switches are operable to change a gain at the output node.

19. The device of claim 18, wherein the gain at the output node has a first gain value when a switch of the plurality of switches is activated and a second gain value when the switch is deactivated.

20. The device of claim 18, wherein the plurality of switches are operable to change the gain in response to being activated and deactivated.

21. The device of claim 18, wherein the programmable resistance comprises a third circuit, and
   wherein at least one switch provides a first resistance value in parallel with the reference resistive element when activated and is effectively removed from the third circuit when deactivated.

22. The device of claim 21, wherein the first resistance value comprises a source-drain resistance of the switch.

23. The device of claim 21, wherein the first resistance value of the switch corresponds to a programmable gain step for the third circuit.

24. The device of claim 18, wherein the voltage buffer comprises a differential voltage buffer including two branches, each branch including
   a gain stage, and
   a programmable resistance coupled in series and in communication with the gain stage, the programmable resistance including a plurality of switches in parallel with a reference resistive element.

25. The device of claim 24, wherein at least one switch from each of the two branches are together operative to be activated and deactivated substantially simultaneously.

26. The device of claim 18, further comprising a third circuit operative to control an accuracy of the gain.

27. A device comprising:
   a first circuit operative to provide a voltage signal;
   a second circuit;
   a voltage buffer coupled between the first and second circuits and operative to provide a programmable gain to the voltage signal, the voltage buffer comprising:
      a gain stage;
      a programmable resistance coupled in series and in communication with the gain stage, the programmable resistance including a plurality of switches in parallel with a reference resistive element; and
      an output node coupled between the gain stage and the programmable resistance, wherein the plurality of switches are operable to change a gain at the output node, at least one switch being used as a variable resistance to adjust an effective resistance value at the output node, and the gain is proportional to an equivalent resistance at the output node.

28. A device comprising:
a first circuit operative to provide a voltage signal;
a second circuit;
a voltage buffer coupled between the first and second circuits and operative to provide a programmable gain to the voltage signal, the voltage buffer comprising:
  a gain stage;
  a programmable resistance in communication with the gain stage, the programmable resistance including a switch in parallel with a resistive element; and
  a third circuit operative to control an accuracy of the gain, the third circuit comprising:
    a reference resistive element;
    a tunable resistive element in parallel with the reference resistive element, the tunable resistive element operative to track a resistance of the reference resistive element and having a gate with a bias voltage; and
    an output line coupled to the gate of the tunable resistive element and a gate of the switch.

29. A programmable gain voltage buffer comprising:
a gain stage;
means for providing a programmable resistance coupled in series and in communication with the gain stage, the programmable resistance including plural switching means in parallel with reference resistive means; and
an output node coupled between the gain stage and the programmable resistance,
wherein the switching means includes means for changing a gain at the output node.

30. The voltage buffer of claim 29, wherein the gain at the output node has a first gain value when the switching means is activated and a second gain value when the switching means is deactivated.

31. The voltage buffer of claim 29, wherein the switching means is operable to change the gain in response to being activated and deactivated.

32. The voltage buffer of claim 29, wherein the switching means provides a first resistance value in parallel with the reference resistive means when activated and is effectively removed when deactivated.

33. The voltage buffer of claim 32, wherein the first resistance value comprises a source-drain resistance of a switch.

34. The voltage buffer of claim 32, wherein the first resistance value of the switching means corresponds to a programmable gain step for a circuit comprising the programmable resistance.

35. The voltage buffer of claim 29, wherein the voltage buffer comprises a differential voltage buffer including two branches, each branch including
  a gain stage, and
  means for providing a programmable resistance coupled in series and in communication with the gain stage, the programmable resistance including plural switching means in parallel with reference resistive means.

36. The voltage buffer of claim 35, wherein at least a portion of the switching means in the two branches are operative to be activated and deactivated substantially simultaneously.

37. The voltage buffer of claim 29, further comprising a circuit including means for controlling an accuracy of the gain.

38. A programmable gain voltage buffer comprising:
a gain stage;
means for providing a programmable resistance coupled in series and in communication with the gain stage, the programmable resistance including plural switching means in parallel with reference resistive means; and
an output node coupled between the gain stage and the programmable resistance,
wherein at least one switching means includes means for changing a gain at the output node, the at least one switching means being used as a variable resistance to adjust an effective resistance value at the output node, and the gain is proportional to an equivalent resistance at the output node.

39. A programmable gain voltage buffer comprising:
a gain stage;
means for providing a programmable resistance in communication with the gain stage, the programmable resistance including switching means in parallel with resistive means; and
a circuit including means for controlling an accuracy of the gain, the second circuit comprising:
  means for providing a reference resistance;
  means for providing a tunable resistance in parallel with the means for providing the reference resistance, the means for providing the tunable resistance including means for tracking a resistance of the reference resistive means and having a gate with a bias voltage; and
an output line coupled to said gate and a gate of the switching means.

* * * * *

UNITED STATES PATENT AND TRADEMARK OFFICE
CERTIFICATE OF CORRECTION

| | | |
|---|---|---|
| PATENT NO. | : 7,173,489 B1 | Page 1 of 1 |
| APPLICATION NO. | : 10/648632 | |
| DATED | : February 6, 2007 | |
| INVENTOR(S) | : Yonghua Song and Sang Won Son | |

It is certified that error appears in the above-identified patent and that said Letters Patent is hereby corrected as shown below:

On the Title Page Item (73) Assignee; replace:
"Marvell Semiconductor, Inc., Hamilton, (BM)" with --Marvell International Ltd, Hamilton, Bermuda--

Signed and Sealed this

Nineteenth Day of February, 2008

JON W. DUDAS
*Director of the United States Patent and Trademark Office*